United States Patent
Hwang et al.

(10) Patent No.: US 7,427,564 B2
(45) Date of Patent: Sep. 23, 2008

(54) METHOD FOR FORMING STORAGE NODE CONTACT PLUG IN SEMICONDUCTOR DEVICE

(75) Inventors: Chang-Youn Hwang, Kyoungki-do (KR); Hyung-Hwan Kim, Kyoungki-do (KR); Ik-Soo Choi, Kyoungki-do (KR); Hae-Jung Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 113 days.

(21) Appl. No.: 11/418,720

(22) Filed: May 5, 2006

(65) Prior Publication Data

US 2007/0123040 A1    May 31, 2007

(30) Foreign Application Priority Data

Nov. 28, 2005    (KR) ...................... 10-2005-0114363

(51) Int. Cl.
*H01L 21/44* (2006.01)

(52) U.S. Cl. ...................... 438/673; 438/672; 438/637; 438/638

(58) Field of Classification Search ......... 438/637–638, 438/672–673
See application file for complete search history.

(56) References Cited

U.S. PATENT DOCUMENTS

| 6,368,959 B1 | 4/2002 | Nakamura |
| 6,682,984 B1 * | 1/2004 | Wu et al. ...................... 438/397 |
| 2002/0196653 A1 * | 12/2002 | Kim et al. ................... 365/100 |
| 2004/0072104 A1 | 4/2004 | Choi et al. |

FOREIGN PATENT DOCUMENTS

| CN | 1162845 | 10/1994 |
| JP | 2002-141412 | 5/2002 |
| KR | 1997-0003978 | 1/1997 |

* cited by examiner

*Primary Examiner*—Dung A. Le
(74) *Attorney, Agent, or Firm*—Townsend and Townsend and Crew LLP (57) ABSTRACT

A method for forming a storage node contact plug in a semiconductor device is provided. The method includes: forming an inter-layer insulation layer over a substrate having a conductive plug; etching a portion of the inter-layer insulation layer using at least line type storage node contact masks as an etch mask to form a first contact hole with sloping sidewalls; etching another portion of the inter-layer insulation layer underneath the first contact hole to form a second contact hole exposing the conductive plug, the second contact hole having substantially vertical sidewalls; and filling the first and second storage node contact holes to form a storage node contact plug.

22 Claims, 12 Drawing Sheets

METHOD FOR FORMING STORAGE NODE CONTACT PLUG IN SEMICONDUCTOR DEVICE

BACKGROUND OF THE INVENTION

The present invention relates to a method for fabricating a semiconductor device; and more particularly, to a method for forming a storage node contact plug in a semiconductor device.

In storage node contact plugs with a feature size of less than 80 nm, the large scale of integration in semiconductor devices have led to formation of hole type contacts using ArF photoresist.

Figure 1:
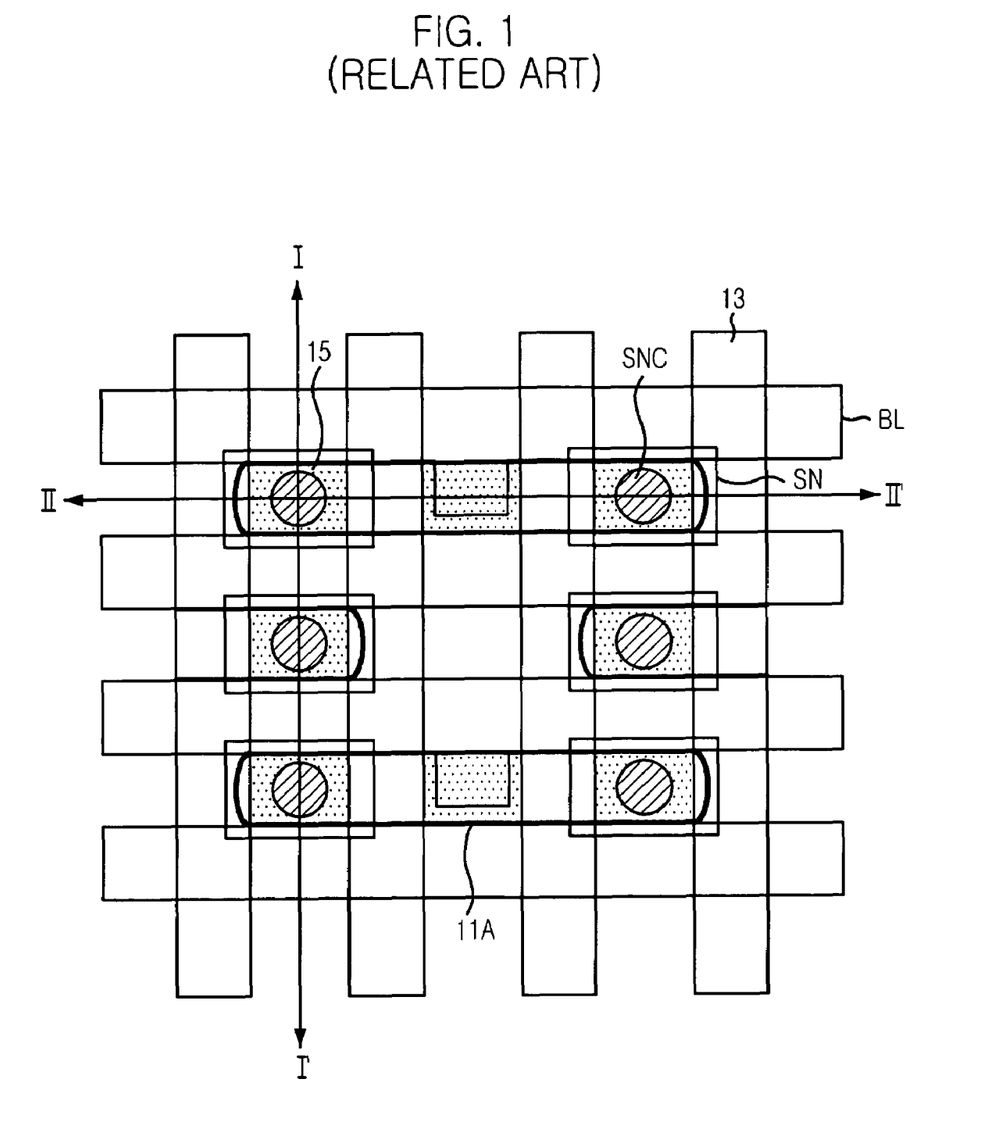
FIG. 1 is a top view illustrating a typical semiconductor device.

FIG. 1 is a top view illustrating a typical semiconductor device.

A plurality of gate lines 13 are arranged on active regions 11A in one direction. A plurality of landing plug contacts 15 are formed on the respective active regions 11A between the gate lines 13. A plurality of bit lines BL are arranged perpendicular to the gate lines 13 to be connected with a group of the landing plug contacts 15. A plurality of storage node contact plugs SNC are formed on the landing plug contacts 15 in a region where the bit lines BL and the gate lines 13 cross with each other. A plurality of storage nodes SN are formed on the storage node contact plugs SNC.

Figure 2:
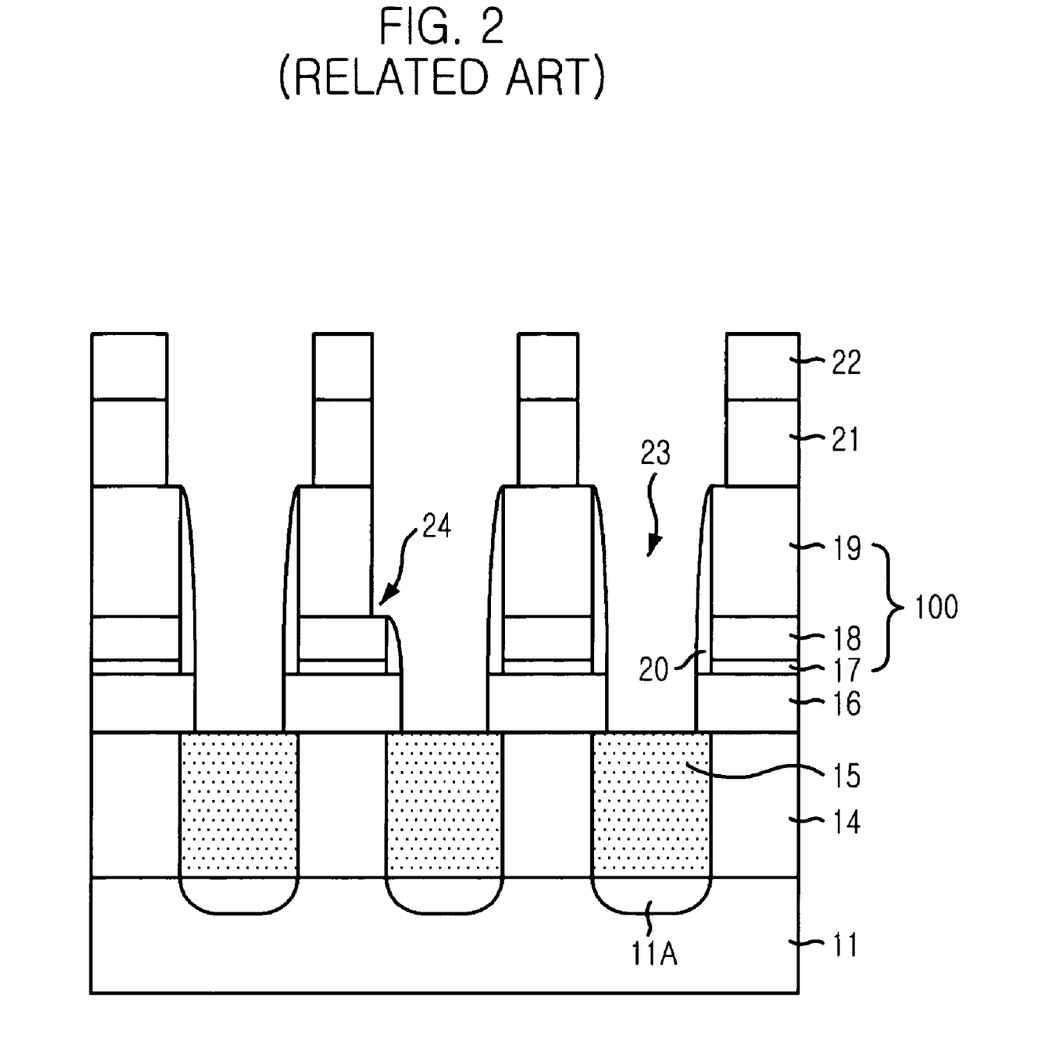
FIG. 2 is a cross-sectional view of the typical semiconductor device taken along the line I-I' of FIG. 1.
Figure 3:
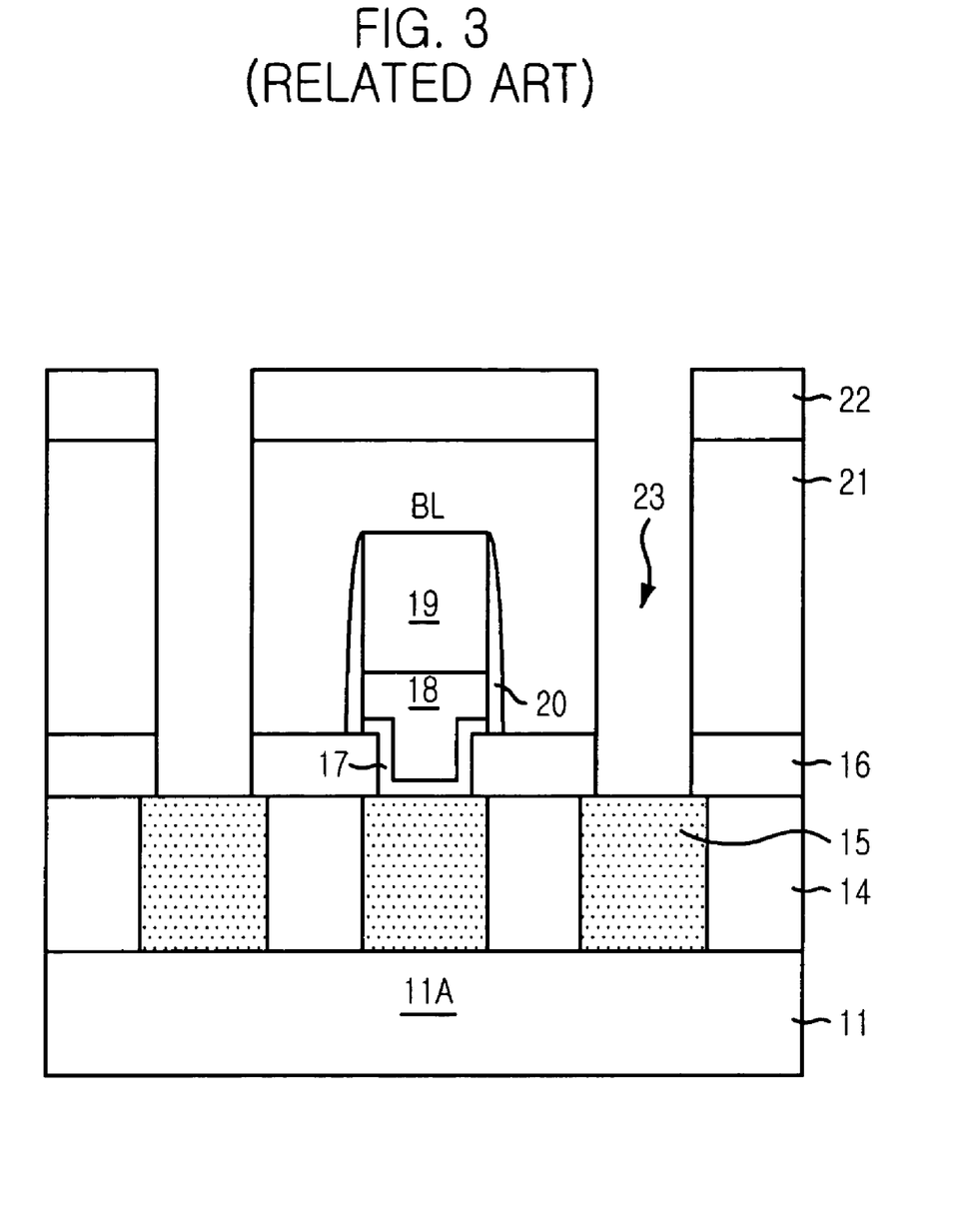
FIG. 3 is a cross-sectional view of the typical semiconductor device taken along the line II-II' of FIG. 1.

FIG. 2 is a cross-sectional view illustrating the typical semiconductor device taken along the line I-I' of FIG. 1. FIG. 3 is a cross-sectional view illustrating the typical semiconductor device taken along the line II-II' of FIG. 1.

Referring to FIGS. 2 and 3, device isolation layers (not shown) are formed in predetermined areas of a substrate 11 to define the active regions 11A. The plurality of the gate lines 13 (see FIG. 1) are formed on the substrate 11, and gate line spacers are formed on the sidewalls of the gate lines 13.

A first inter-layer insulation layer 14 is formed on the gate lines 13 and planarized thereafter. The first inter-layer insulation layer 14 is etched to form contact holes (not shown) which expose the active regions 11A between the gate lines 13. Then the landing plug contacts 15 are formed on the active regions 11A.

A second inter-layer insulation layer 16 is formed on the landing plug contacts 15 and the first inter-layer insulation layer 14, and a plurality of bit line patterns 100 are formed on the second inter-layer insulation layer 16. Each of the bit line patterns 100 includes a barrier metal layer 17, a bit line tungsten layer 18 and a bit line hard mask nitride layer 19, which are formed in sequential order. The barrier metal layer 17 is obtained by sequentially forming TiN and Ti.

Bit line spacers 20 are formed on the sidewalls of the bit line patterns 100. A third inter-layer insulation layer 21 is formed on the bit line patterns 100 until the third inter-layer insulation layer 21 fills spaces between the bit line patterns 100. Hole type storage node contact masks 22 are formed on the third inter-layer insulation layer 21.

Using the storage node contact masks 22 as an etch mask, the third inter-layer insulation layer 21 and the second inter-layer insulation layer 16 are etched to form storage node contact holes 23, which expose the surface of the landing plug contacts 15. This etching process for forming the storage node contact holes 23 employs a self-aligned contact (SAC) etching process.

Although not illustrated, storage node contact plugs SNC are formed by filling the storage node contact holes 23 with a polysilicon layer using a plug isolation process. The storage nodes SN are then formed on the storage node contact plugs SNC.

However, since the storage node contact plugs are formed in the storage node contact holes, the open area at the top part of each of the storage node contact plugs is generally small. Thus, the overlay margin for the storage nodes becomes too small, requiring the formation of a pad polysilicon layer between the storage node contact plugs and the storage nodes.

When the etching process for forming the storage node contact holes is performed, an ArF photoresist material is often used. For this process, an expensive etching apparatus is generally used increasing the maintenance cost, thereby impeding mass production. Also, during the etching process for forming the storage node contact holes, the bit line hard mask layer is more likely to be damaged and this damage is denoted with reference numeral 24 in FIG. 2. The damage to the bit line hard mask layer may cause SAC failures such as a short circuit between the storage nodes and the storage node contact plugs.

SUMMARY OF THE INVENTION

In one embodiment of the present invention relates to providing a method for forming a storage node contact plug in a semiconductor device, wherein the method can increase the open area at the top part of a storage node contact plug, reduce the generation of a SAC failure between a storage node and the storage node contact plug and reduce manufacturing costs using a cost-effective apparatus.

In accordance with an aspect of the present invention, there is provided a method for forming a storage node contact plug in a semiconductor device including: forming an inter-layer insulation layer over a semi-finished substrate where landing plug contacts are formed; forming line type storage node contact masks over the inter-layer insulation layer; etching portions of the inter-layer insulation layer using the line type storage node contact masks as an etch mask to form first contact holes with extended sidewalls (or sloping sidewalls); etching portions of the inter-layer insulation layer underneath the first contact holes to form second contact holes exposing the respective landing plug contacts; and forming storage node contact plugs in storage node contact holes, each including the first contact hole and the second contact hole.

In accordance with another aspect of the present invention, there is provided a method for forming a storage node contact plug in a semiconductor device including: forming a first insulation layer over a semi-finished substrate where landing plug contacts are formed; forming a plurality of bit line patterns over the first insulation layer, wherein each of the bit line patterns includes a hard mask formed in triple layers; forming a second insulation layer over the bit line patterns until the spaces between the bit line patterns are filled; planarizing the second insulation layer until a second layer of the hard mask is exposed; forming line type storage node contact masks over the planarized second insulation layer; sequentially etching the second insulation layer and the first insulation layer using the storage node contact masks as an etch mask to form storage node contact holes, each exposing the respective landing plug contacts between the bit line patterns and having an entrance width larger than the width of the uniform section below the entrance; and forming the storage node contact plugs in the storage node contact holes.

In one embodiment, a method for forming a storage node contact plug in a semiconductor device includes forming an inter-layer insulation layer over a substrate having a conductive plug. A portion of the inter-layer insulation layer is etched using at least line type storage node contact masks as an etch mask to form a first contact hole with sloping sidewalls. Another portion of the inter-layer insulation layer is etched underneath the first contact hole to form a second contact hole exposing the conductive plug, the second contact hole having substantially vertical sidewalls. The first and second storage node contact holes are filled to form a storage node contact plug that contacts the conductive plug.

In another embodiment, a method for forming a storage node contact plug in a semiconductor device includes forming a first insulation layer over a substrate having a conductive plug; forming a plurality of bit line patterns over the first insulation layer, wherein each of the bit line patterns includes a hard mask formed having first, second, and third layers; forming a second insulation layer over the bit line patterns until a space between the bit line patterns is filled; planarizing the second insulation layer until the second layer of the hard mask is exposed; forming line type storage node contact masks over the planarized second insulation layer; sequentially etching the second insulation layer and the first insulation layer using the storage node contact masks as an etch mask to form a storage node contact hole between the bit line patterns, the storage node contact hole exposing the conductive plug, the storage node contact hole having an upper portion having sloping walls and a lower portion having vertical walls; and filling the storage node contact hole to form the storage node contact plug that contacts the conductive plug.

In yet another embodiment, a method for forming a storage node contact plug in semiconductor device includes forming an inter-layer insulation layer over a substrate having a conductive plug. A first portion of the inter-layer insulation layer is etched to define a first trench having substantially vertical sidewalls. A second portion of the inter-layer insulation layer is etched to convert the first trench into a second trench having sloping sidewalls. A third portion of the inter-layer insulation layer is etched to form a third trench having substantially vertical sidewalls, the second trench and the third trench being connected to define a storage node contact hole. The storage node contact hole is filled to form a storage node contact plug that contacts the conductive plug. The first portion is etched anisotropically, e.g., dry etching. The second portion is etched isotropically, e.g., wet etching. The third portion is etched anisotropically, e.g., dry etching. In one implementation, the second portion may be etched using an isotropic dry etching method.

BRIEF DESCRIPTION OF THE DRAWINGS

The text above and other features of the present invention will become better understood with respect to the following description of the embodiments given in conjunction with the accompanying drawings, in which.

DETAILED DESCRIPTION OF THE INVENTION

Hereinafter, various embodiments of the present invention will be described in detail with reference to the accompanying drawings.

Figure 4:
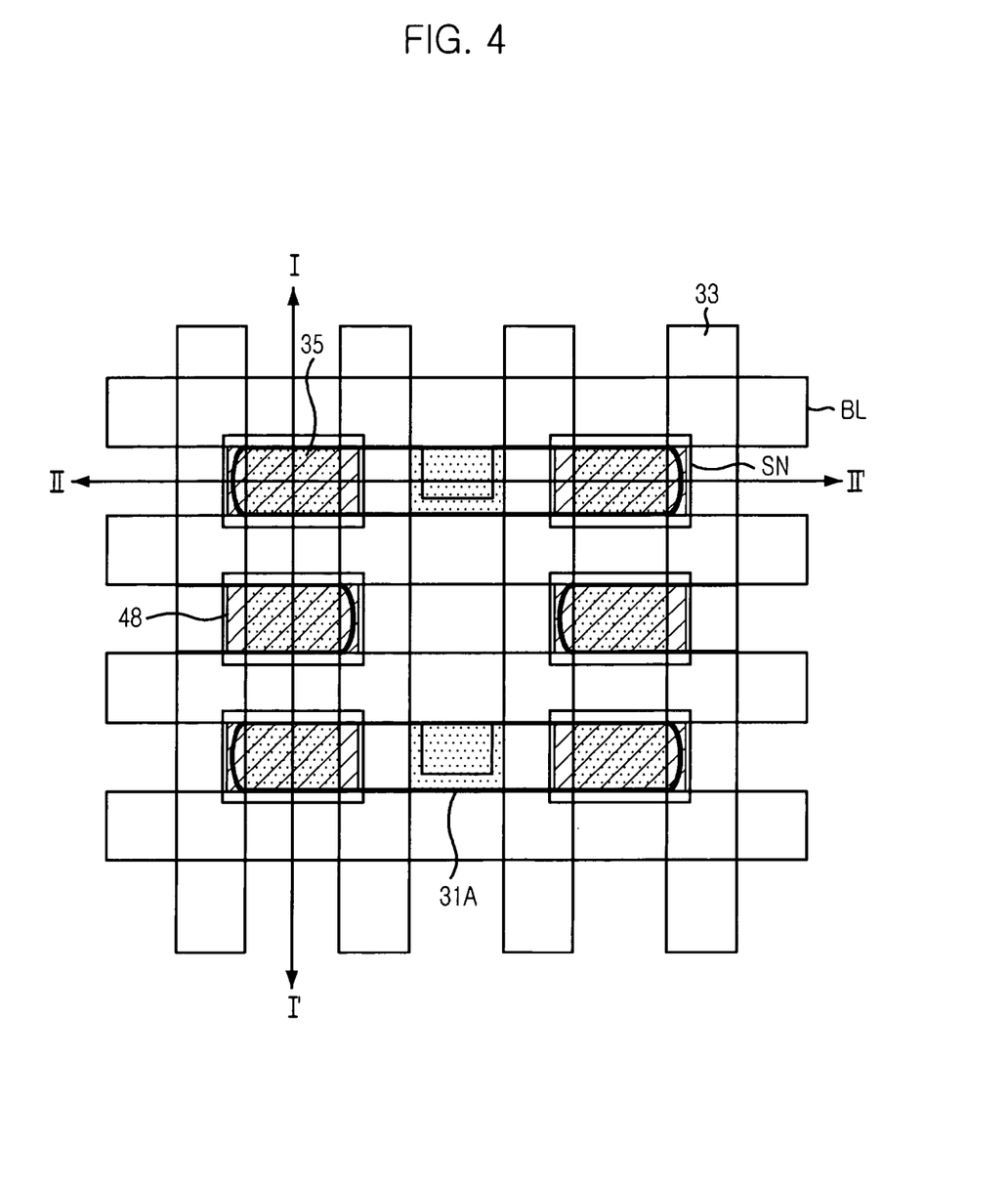
FIG. 4 is a top view of a semiconductor device in accordance with an embodiment of the present invention.

FIG. 4 is a top view of a semiconductor device in accordance with an embodiment of the present invention.

As illustrated, a plurality of gate lines 33 are arranged over active regions 31A. A plurality of landing plug contacts 35 are formed over the active regions 31A disposed between the gate lines 33 and a plurality of bit lines BL arranged perpendicular to the gate lines 33 to be coupled with a group of the landing plug contacts 35.

A plurality of storage node contact plugs 48 are formed over the landing plug contacts 35 in a region where the gate lines 33 and the bit lines BL cross each other. A plurality of storage nodes SN are formed over the storage node contact plugs 48.

Although not illustrated, using line type storage node contact masks, storage node contact holes are created where the storage node contact plugs 48 are formed having wide openings. The storage node contact masks are formed using a KrF photoresist material.

FIGS. 5A to 5F are cross-sectional views taken along the line II-II' of FIG. 4 for illustrating a method for forming a storage node contact plug in accordance with an embodiment of the present invention. FIGS. 6A to 6F are cross-sectional views taken along the line I-I' of FIG. 4 for illustrating the same method in accordance with the embodiment of the present invention. Herein, the like reference numerals denote like elements described in FIG. 4.

Figure 5A:
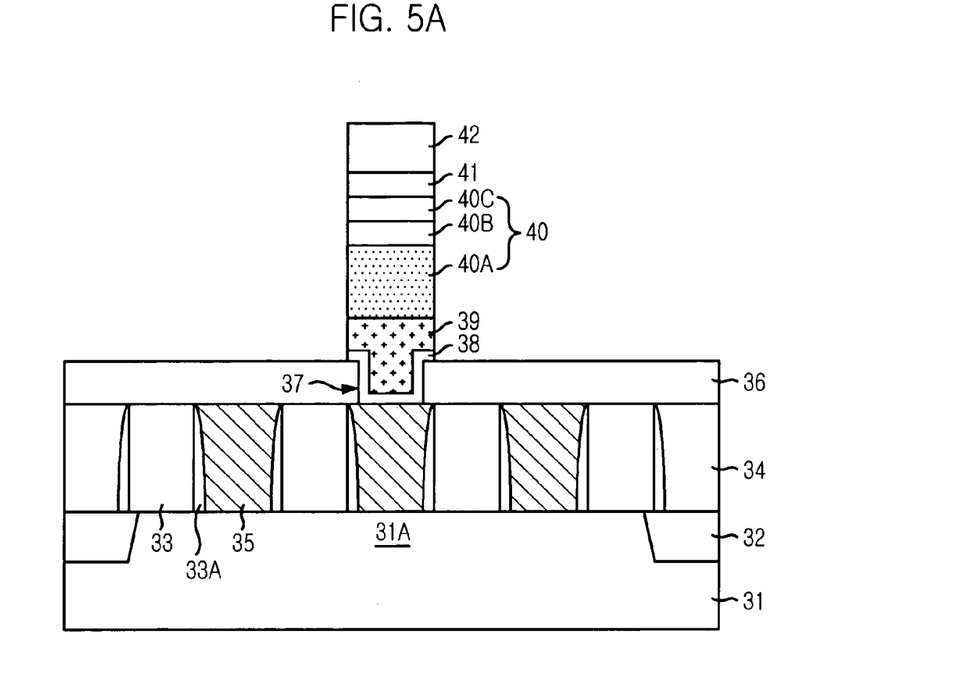
FIGS. 5A to 5F are cross-sectional views taken along the line II-II' of FIG. 4 for illustrating a method for forming a storage node contact plug in accordance with an embodiment of the present invention.
Figure 6A:
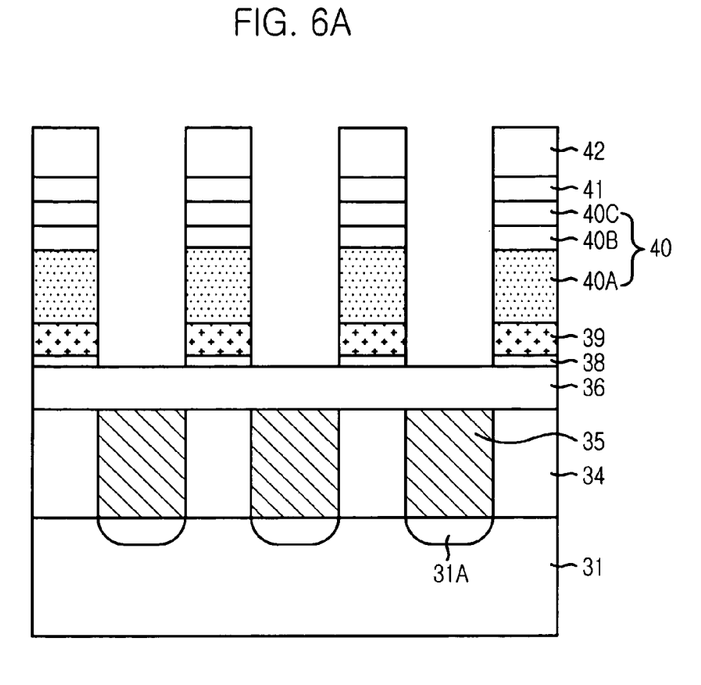
FIGS. 6A to 6F are cross-sectional views taken along the line I-I' of FIG. 4 for illustrating the method for fabricating the storage node contact plug in accordance with the embodiment of the present invention.

Referring to FIGS. 5A and 6A, device isolation layers 32 are formed in predetermined areas of a substrate 31 to define active regions 31A. A plurality of gate lines 33 are formed over the substrate 31, and gate spacers 33A are formed on the sidewalls of the gate lines 33.

A first inter-layer insulation layer 34 is formed over the above resulting structure until the spaces between the gate lines 33 are filled; thereafter, the layer is planarized. The planarization of the first inter-layer insulation layer 34 proceeds with a chemical mechanical polishing (CMP) process, which continues until the upper surface of the gate lines 33 is exposed.

The first inter-layer insulation layer 34 is etched to form contact holes (not shown) exposing the active regions 31A disposed between the gate lines 33. Then landing plug contacts 35 are formed over the active regions 31A. More specifically, the landing plug contacts 35 are formed by filling a polysilicon layer into the contact holes (not shown) and performing an etch-back process or a CMP process on the polysilicon layer.

A second inter-layer insulation layer 36 is formed over the landing plug contacts 35 and selectively etched to form bit line contact holes 37 exposing a group of the landing plug contacts 35 to be coupled with bit lines, which will be formed subsequently.

A barrier layer 38 for the bit lines (hereinafter referred to as "bit line barrier layer") is formed over the second inter-layer insulation layer 36 patterned by the above selective etching process for forming the bit line contact holes 37. The bit line barrier layer 38 is formed in a dual structure of Ti/TiN and has a thickness ranging from approximately 100 Å to approximately 1,000 Å. The bit line barrier layer 38 is particularly formed using an ionized metal ion plasma (IMP) method, and afterwards, an annealing process may be performed at approximately 850° C. for approximately 20 seconds. After the annealing process, an adhesion layer may be formed using an IMP method. The adhesion layer may include TiN.

A bit line metal layer 39 is formed over the bit line barrier layer 38 using a chemical vapor deposition (CVD) method. The bit line metal layer 39 includes tungsten and has a thickness ranging from approximately 300 Å to approximately 1,000 Å. A bit line hard mask layer 40 is formed over the bit line metal layer 39. The bit line hard mask layer 40 has a triple structure including a nitride layer 40A, a tungsten layer 40B and an amorphous carbon layer 40C, which are formed in sequential order. The total thickness of the bit line hard mask layer 40 is substantially the same as the thickness of a single bit line hard mask layer, which is typically a nitride layer, in order to maintain the gap-fill characteristic when a third inter-layer insulation layer is formed subsequently. For instance, the nitride layer 40A of the bit line hard mask layer 40 includes a plasma enhanced nitride material and has a thickness ranging from approximately 1,000 Å to approximately 2,500 Å. The tungsten layer 40B of the bit line hard mask layer 40 and the amorphous carbon layer 40C are formed to a thickness of approximately 300 Å to approximately 800 Å and a thickness of approximately 1,000 Å to approximately 2,000 Å, respectively.

An anti-reflective coating layer 41 is formed over the bit line hard mask layer 40. The anti-reflective coating layer 41 includes silicon oxynitride (SiON) and has a thickness ranging from approximately 300 Å to approximately 1,000 Å.

Bit line masks 42 are formed through performing a predetermined process on a photoresist material. Then an etching process is performed using the bit line masks 42 as an etch barrier to form a plurality of bit line patterns. Each of the bit line patterns includes a stack structure of the bit line barrier layer 38, the bit line metal layer 39 and the bit line hard mask layer 40, which are patterned by the above etching process.

The anti-reflective coating layer 41 and the bit line hard mask layer 40 are etched using a gas mixture of $CF_4/CHF_3/O_2/Ar$ under specific conditions of: pressure at approximately 20 mTorr to approximately 70 mTorr; and power at approximately 300 W to approximately 1,000 W. The bit line metal layer 39 and the bit line barrier layer 38 are etched using a gas mixture of $SF_6/BCl_3/N_2/Cl_2$ under specific conditions of: pressure at approximately 20 mTorr to approximately 70 mTorr; and power at approximately 300 W to approximately 1,000 W.

Figure 5B:
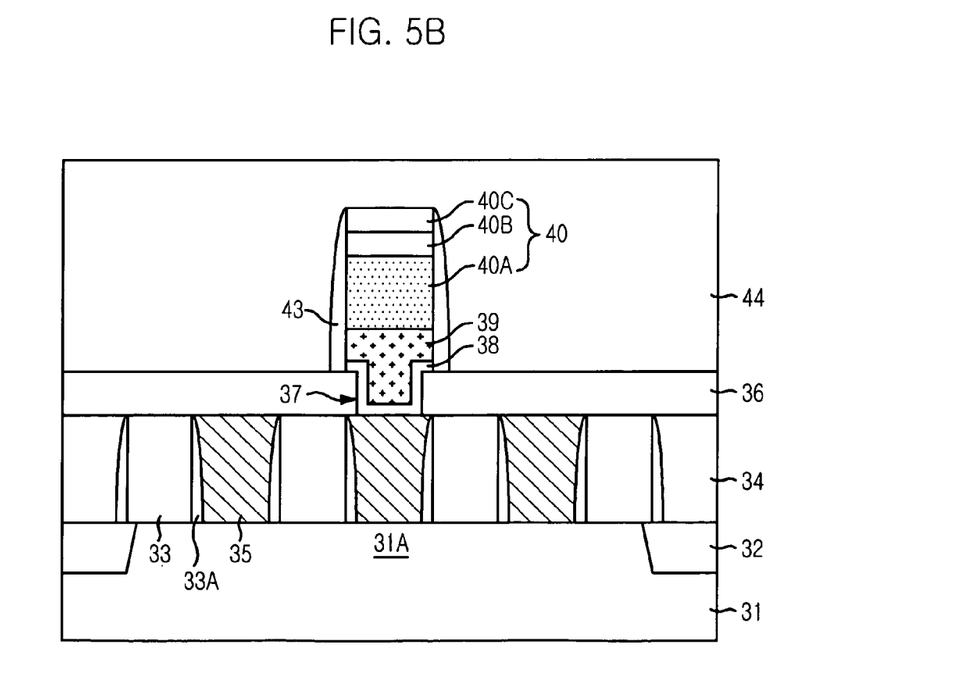
Figure 6B:
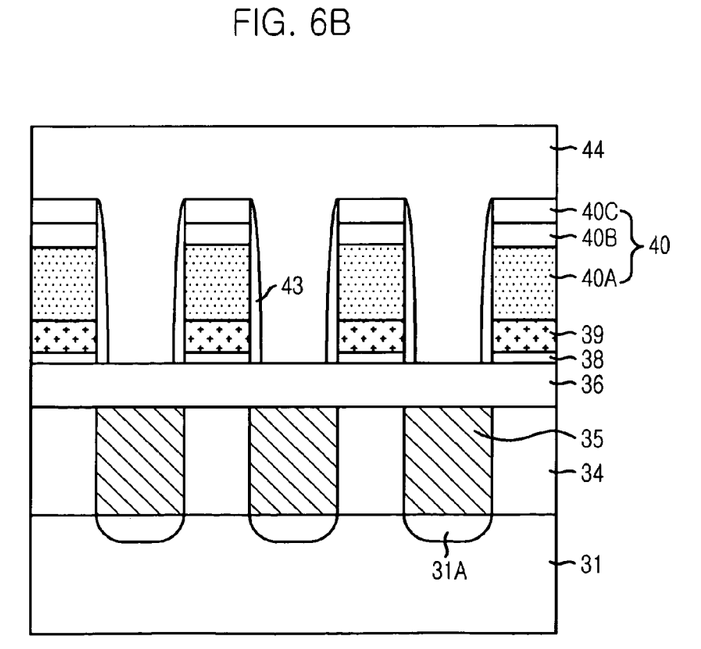

Referring to FIGS. 5B and 6B, the bit line masks 42 are stripped. At this point, the anti-reflective coating layer 41 is also removed, exposing the bit line patterns.

Although not illustrated, a nitride layer is formed in a thickness of approximately 50 Å to approximately 150 Å over the bit line patterns and over the second inter-layer insulation layer 36. The nitride layer is then etched to form bit line spacers 43 on the sidewalls of the bit line patterns.

A third inter-layer insulation layer 44 is formed over the above resulting structure, filling the spaces between the bit line patterns. The third inter-layer insulation layer 44 includes a high density plasma oxide material and has a thickness of approximately 4,000 Å to approximately 10,000 Å. Therefore, the third inter-layer insulation layer 44 is formed with a certain thickness above the bit line patterns filling the spaces between the bit line patterns.

Figure 5C:
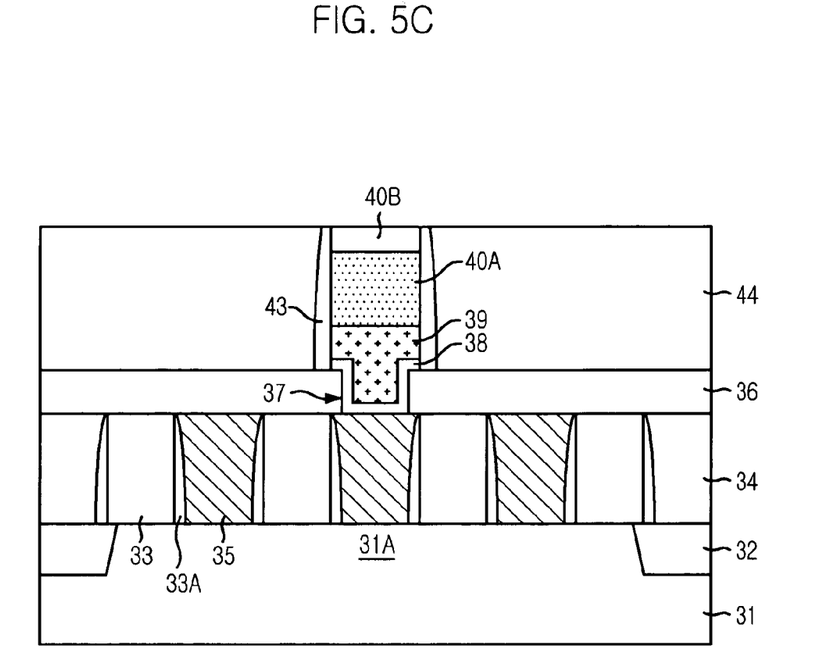
Figure 6C:
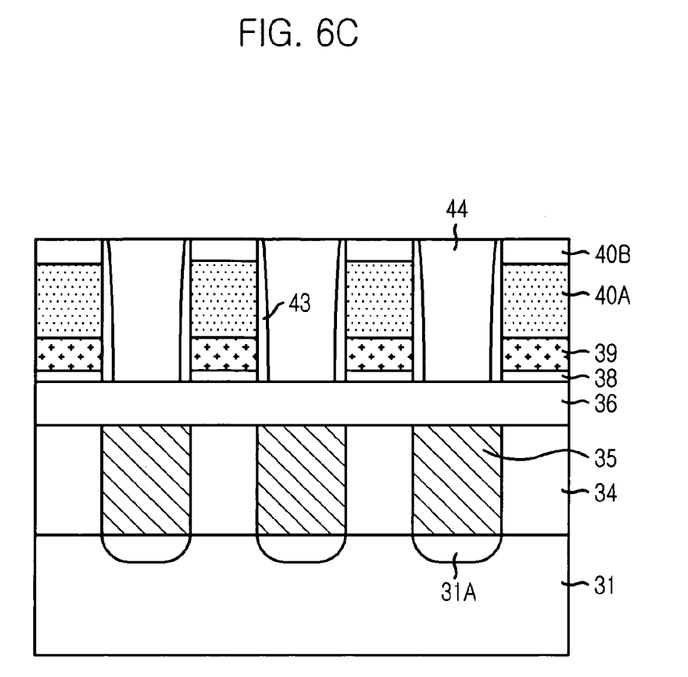

Referring to FIGS. 5C and 6C, a chemical mechanical polishing (CMP) process is performed to planarize the third inter-layer insulation layer 44. Herein, this CMP process will be referred to as "ILD CMP process." The ILD CMP process is continued until reaching the tungsten layer 40B of the bit line hard mask layer 40.

More specifically, the ILD CMP process is performed on the third inter-layer insulation layer 44 and the amorphous carbon layer 40C of the bit line hard mask layer 40, so that the tungsten layer 40B is exposed. Since the amorphous carbon layer 40C has a similar polishing rate to the third inter-layer insulation layer 44, the third inter-layer insulation layer 44 can be planarized uniformly.

Removing the amorphous carbon layer 40C during the ILD CMP process can reduce the burden of etching for subsequent storage node contacts due to the triple structure of the bit line hard mask layer 40.

Figure 5D:
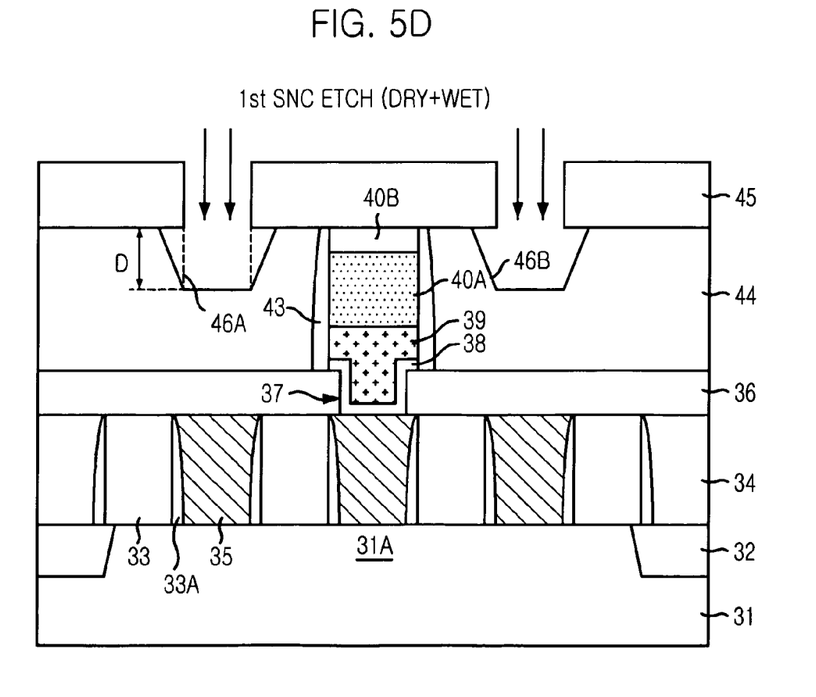
Figure 6D:
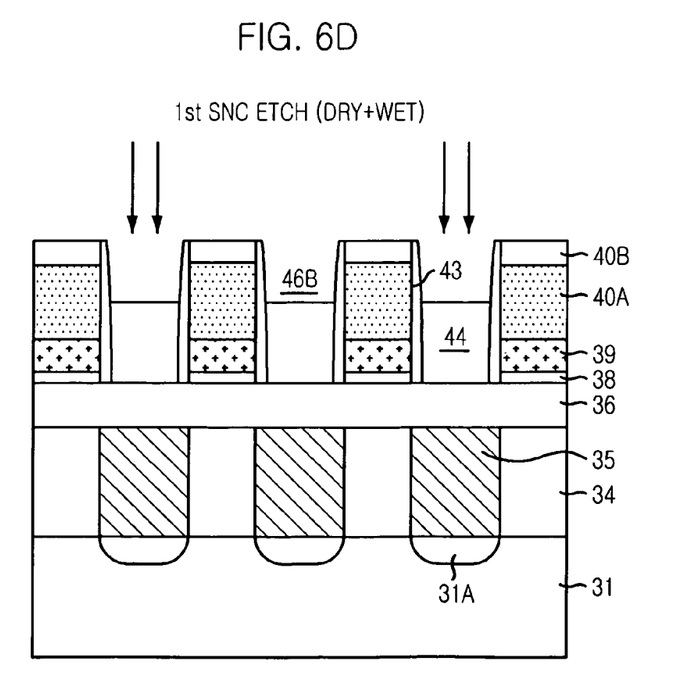

Referring to FIGS. 5D and 6D, a KrF photoresist material (not shown) is coated over the resulting structure illustrated in FIGS. 5C and 6C and patterned via a photo-exposure and developing process to form storage node contact masks 45. The storage node contact masks 45 are line type masks which open portions of the third inter-layer insulation layer 44 where storage node contact holes are to be formed. Particularly, the storage node contact masks 45 are formed perpendicular to the bit line patterns.

An etching process for forming the aforementioned storage node contacts is performed using the storage node contact masks 45. In more detail, the etching process proceeds with two etching operations. A first etching process, herein referred to as the first storage node contact etching process, is a partial etching process that etches the third inter-layer insulation layer 44 to a predetermined depth D not exposing the landing plug contacts 35 disposed between the bit line patterns but a sidewall portion of the nitride layer 40A of the bit line hard mask layer 40. Reference numeral 46A denotes first contact holes formed by the first storage node contact etching process.

The first storage node contact etching process is carried out by combining dry etching and wet etching together. The dry etching is performed at specific conditions of: pressure at approximately 15 mTorr to approximately 50 mTorr; power at approximately 1,000 W to approximately 2,000 W; and a gas mixture including at least two or more of the following gases: $CF_4$, $C_4F_8$, $C_5F_8$, $C_4F_6$, $CHF_3$, $CH_2F_2$, Ar, $O_2$, CO, and $N_2$. The etch target thickness of the third inter-layer insulation layer 44 ranges from approximately 1,000 Å to approximately 2,000 Å.

The wet etching uses a solution of HF or buffered oxide etchant (BOE). The wet etching using the HF solution results in lateral etching, and thus, the sidewalls of the first storage node contact holes 46A formed by dry etching are extended laterally, e.g., the sidewalls are sloping and not vertical. Reference numeral 46B denotes second contact holes whose sidewalls have been extended via the wet etching. The sidewalls are sloping down at less than 90 degrees. As used herein, a sidewall that slopes down at less than 90 degrees is referred to as a "sloping sidewall."

By performing the combined dry etching and wet etching for the first storage node contact etching process, particularly, by performing the wet etching after the dry etching, the sidewalls of the first contact holes 46A are extended laterally. That is, the second contact holes 46B a define entrance portions (or openings) of the storage node contact holes 46 (refer to FIGS. 5E and 6E). Hence, an open area of a top part (or an upper opening) of each of the aforementioned storage node contact plugs, which fill the storage node contact holes 46, is enlarged. As a result, a larger overlay margin for the subsequent storage nodes can be obtained.

Figure 5E:
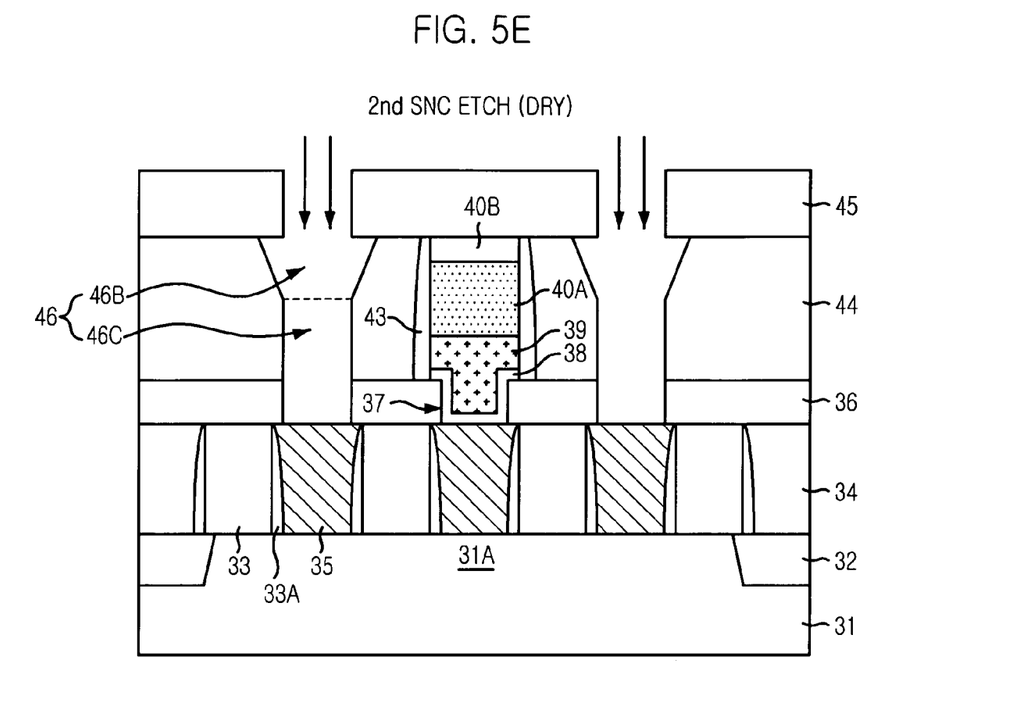
Figure 6E:
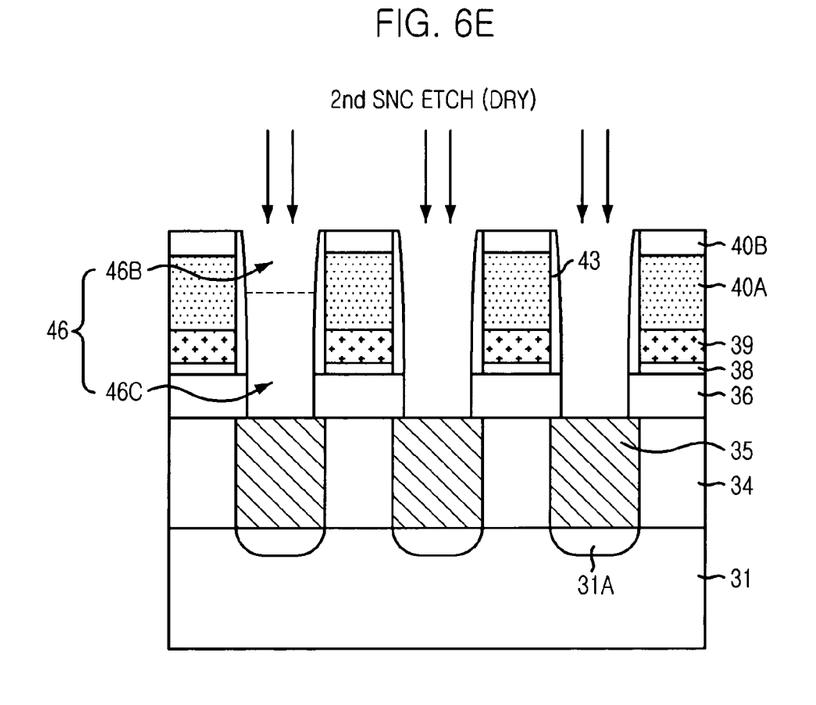

Referring to FIGS. 5E and 6E, a second storage node etching process is performed using the storage node contact masks 45. The second storage node etching process proceeds with a dry etching process, which etches the third inter-layer insulation layer 44 and the second inter-layer insulation layer 36 disposed underneath the second contact holes 46B to form third contact holes 46C exposing the landing plug contacts 35. The dry etching process for forming the third contact holes 46C is carried out at conditions of: pressure at approximately 15 mTorr to approximately 50 mTorr; power at approximately 1,000 W to approximately 2,000 W; and a gas mixture including at least two or more of the following gases: $C_4F_8$, $C_5F_8$, $C_4F_6$, $CH_2F_2$, Ar, $O_2$, CO, and $N_2$.

The second contact holes 46B and the third contact holes 46C comprise the aforementioned storage node contact holes 46. The openings of the second contact holes 46B are made wider as the sidewalls of the first contact holes 46A are extended by the first storage node contact etching process, whereas the third contact holes 46C has a line width smaller than the second contact holes 46B. That is, the contact hole 46 includes an upper portion that has sloping sidewalls and a lower portion that has vertical sidewalls.

Figure 5F:
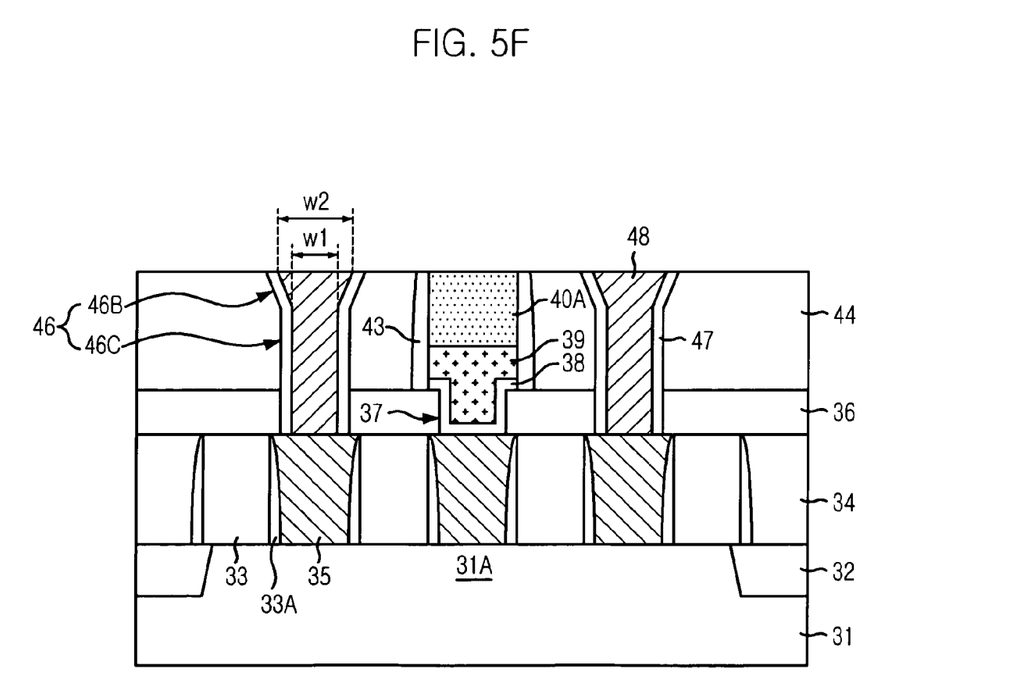
Figure 6F:
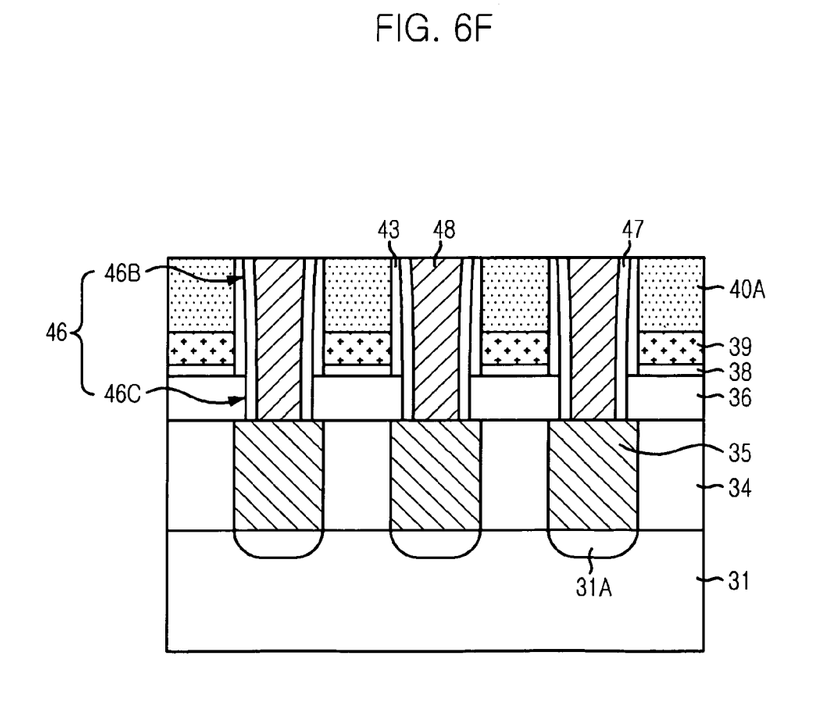

Referring to FIGS. 5F and 6F, the storage node contact masks 45 are stripped and cleaned thereafter, and an insulation layer (e.g., a nitride layer) is formed over the exposed landing plug contacts 35 and the third and second inter-layer insulation layers 44 and 36, patterned by the first and second storage node contact etching processes. An etch-back process is performed on the third and second insulation layers 44 and 36 to form storage node contact spacers 47 contacting the sidewalls of the storage node contact holes 46. While the etch-back process is performed, the tungsten layer 40B of the bit line hard mask layer 40 is also removed.

Although not illustrated, a polysilicon layer fills the storage node contact holes 46, and a CMP process is performed thereon until the nitride layer 40A of the bit line hard mask layer 40 is exposed. Hereinafter, this CMP process is referred to as "SNC CMP process." The SNC CMP process completes the isolation of the polysilicon layer, and as a result, storage node contact plugs 48 are formed.

According to the embodiments of the present invention, using the line type storage node contact masks 45 allows the storage node contact holes 46 to have a wide opening, and the storage node contact plugs 48 are formed therein, so that the open area of the storage node contact plugs 48 is increased. More specifically, as illustrated in FIG. 5F, a width W2 of the entrance portion of the storage node contact plugs 48, i.e., the second contact holes 46B, is smaller than the width W1 of the third contact holes 46C. Hence, the contact area between the storage node contact plugs 48 and the storage nodes becomes wider.

Since the line type storage node contact masks 45 are formed using the KrF photoresist material, an additional hard mask is not necessary to form the storage node contact masks 45. As mentioned previously, an expensive apparatus is required to form a typical storage node contact mask using ArF photoresist material. On the contrary, using the KrF photoresist material increase the cost-effectiveness, and the storage node contact etching process can proceed without using the additional hard mask. Also, since the bit line hard mask layer 40 of each of the bit line patterns is formed in triple structure, damage to the bit line hard mask layer can be minimized during the storage node contact etching process.

Figure 7:
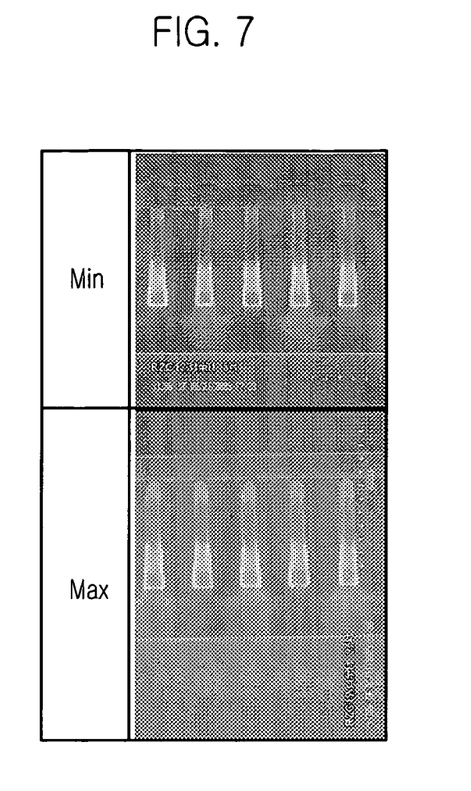
FIG. 7 illustrates scanning electron microscope (SEM) micrograph images of a substrate structure after a chemical mechanical polishing (CMP) process is performed on an inter-layer insulation layer in accordance with an embodiment of the present invention.

FIG. 7 illustrates SEM micrograph images of a substrate structure after an ILD CMP process in accordance with an embodiment of the present invention.

As illustrated, the ILD CMP process is stopped over a tungsten layer of a bit line hard mask layer. The loss of the tungsten layer of the bit line hard mask layer is less than approximately 200 Å, and the loss variation is minimal for each position of a wafer.

Figure 8:
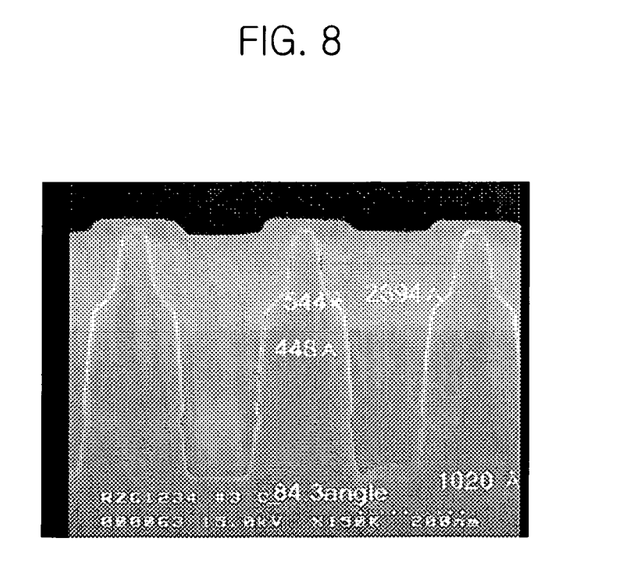
FIG. 8 is a SEM micrograph image illustrating a substrate structure after an etching process for forming a storage node contact in accordance with an embodiment of the present invention.

FIG. 8 is a SEM micrograph image illustrating a substrate structure after a storage node contact etching process in accordance with an embodiment of the present invention. Table 1 below shows the results after the storage node contact etching process in accordance with an embodiment of the present invention.

TABLE 1

| | DICD (nm) | Wet Etch (Å) | FICD (In Line) (nm) | FICD (B-SEM) (nm) | R-W Hard Mask (Å) | R-Nit Hard Mask (Å) | Nit loss (Å) | Top CD (nm) | Bar CD (nm) |
|---|---|---|---|---|---|---|---|---|---|
| Target | 150 | 450 | 95 | — | 0 | 1,200 | 0 | 200 | 54 |
| Data | 148 | 437 | 110 | 106 | 214 | 1,506 | 0 | 243 | 53 |

As shown in Table 1, the loss of the nitride layer of the bit line hard mask layer is approximately 0 Å after the storage node contact etching process.

Figure 9:
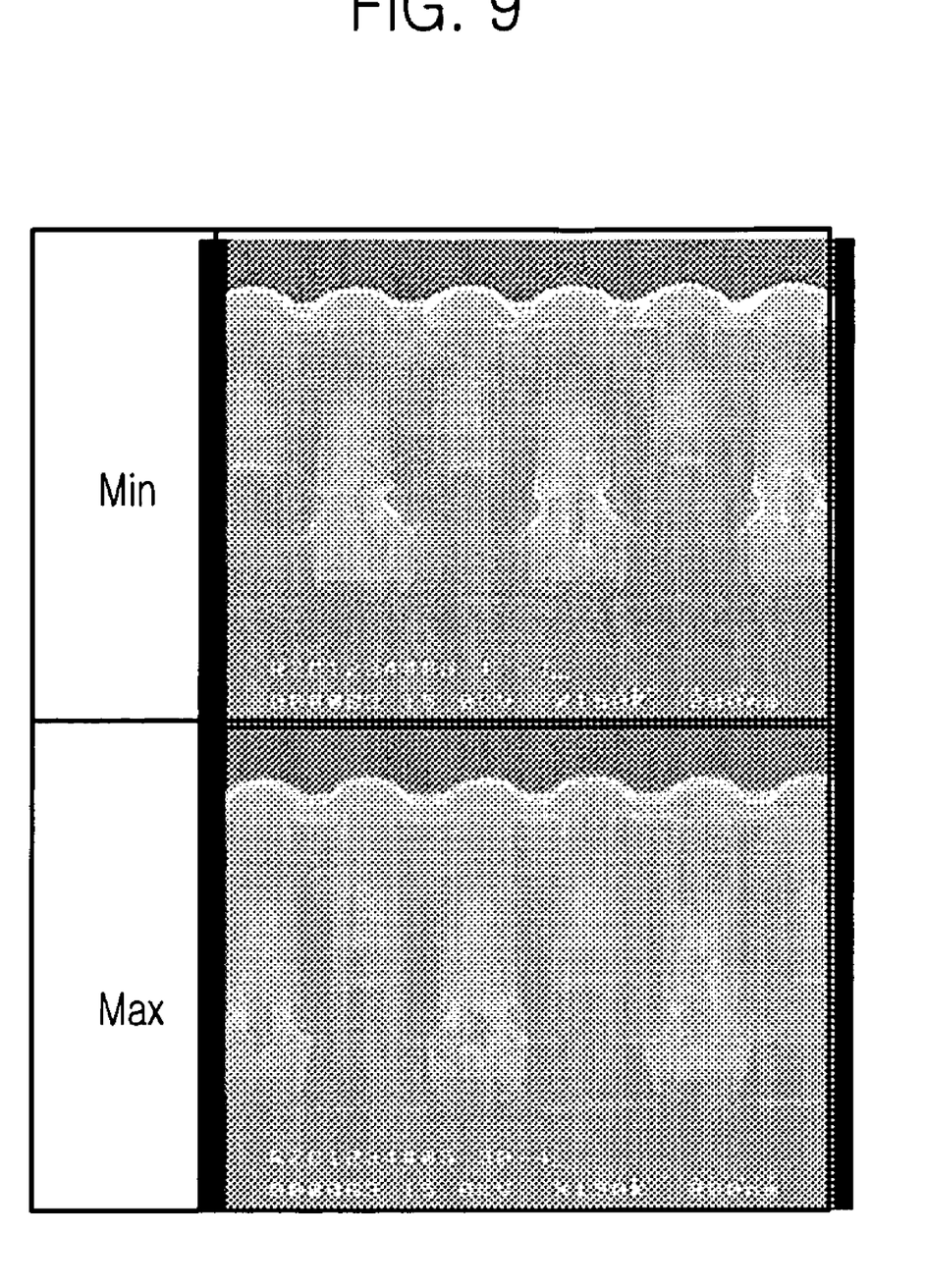
FIG. 9 illustrates SEM micrograph images of a substrate structure after a CMP process is performed on a storage node contact in accordance with an embodiment of the present invention.

FIG. 9 is a SEM micrograph image illustrating a substrate structure after an SNC CMP process in accordance with an embodiment of the present invention. For reference, the isolation critical dimension (CD) between storage node contact plugs can be obtained at more than approximately 40 nm, and thus, a SAC margin can be obtained at an average of 800 Å or so.

According to the embodiments of the present invention, storage node contact holes for forming storage node contact plugs have a wide upper open area using line type storage node contact masks, and storage node contact plugs are formed by filling the storage node contact holes. Because of the wide open area of the storage node contact holes, the storage node contact plugs can make a wide contact with subsequent storage nodes, and thus, an overlay margin for the storage nodes can be increased even without forming a pad polysilicon layer.

Since the line type storage node contact masks are formed using a KrF photoresist material, an additional storage node hard mask is not necessary, contrary to the typical hole type storage node contact masks. Hence, manufacturing costs can be reduced.

In addition, since a bit line hard mask layer of each bit line pattern is formed in triple structure, the loss of the bit line hard mask layer can be minimized during the storage node contact etching process, thereby reducing the occurrence of SAC failures.

The present application contains subject matter related to the Korean patent application No. KR 2005-0114363, filed in the Korean Patent Office on Nov. 28, 2005, the entire contents of which being incorporated herein by reference.

While the present invention has been described with respect to specific embodiments, it will be apparent to those skilled in the art that various changes and modifications may be made without departing from the spirit and scope of the invention as defined in the following claims.

What is claimed is:

1. A method for forming a storage node contact plug in a semiconductor device comprising:
    forming an inter-layer insulation layer over a substrate having a conductive plug;
    etching a portion of the inter-layer insulation layer using at least line type storage node contact masks as an etch mask to form a first contact hole with sloping sidewalls;
    etching another portion of the inter-layer insulation layer underneath the first contact hole to form a second contact hole exposing the conductive plug, the second contact hole having substantially vertical sidewalls; and
    filling the first and second storage node contact holes to form a storage node contact plug,
    wherein the sloping sidewalls define an opening that is wider at an upper portion of the first contact hole than a lower portion of the first contact hole, so that the opening provides an increased contact area for the storage node contact plug.

2. The method of claim 1, wherein the forming of the first contact hole with the sloping sidewalls comprises:
    dry etching the portion of the inter-layer insulation layer using the storage node contact masks as an etch mask to form a trench; and
    wet etching the inter-layer insulation layer patterned by the dry etching to extend the sidewalls of the first contact hole laterally.

3. The method of claim 2, wherein the dry etching is performed at a pressure of approximately 15 mTorr to approximately 50 mTorr; a power of approximately 1,000 W to approximately 2,000 W; a gas mixture including at least two gases selected from the group consisting of $CF_4$, $C_4F_8$, $C_5F_8$, $C_4F_6$, $CHF_3$, $CH_2F_2$, Ar, $O_2$, CO, and $N_2$; and an etch target thickness of the inter-layer insulation layer ranging from approximately 1,000 Å to approximately 2,000 Å.

4. The method of claim 1, wherein the forming of the first contact hole with the sloping sidewalls comprises:
    performing an anisotropic etch on the inter-layer insulation layer to form a first trench; and
    performing an isotropic etch on the inter-layer insulation layer to form a second trench, the second trench having the sloping sidewalls.

5. The method of claim 4, wherein the anisotropic etch is performed before the isotropic etch, the isotropic etch being a wet etch performed using a solution of HF.

6. The method of claim 4, wherein the isotropic etch is a dry etch process.

7. The method of claim 4, wherein the anisotropic etch is performed at a pressure of approximately 15 mTorr to approximately 50 mTorr; a power of approximately 1,000 W to approximately 2,000 W; and a gas mixture including at least two gases selected from the group consisting of $C_4F_8$, $C_5F_8$, $C_4F_6$, $CH_2F_2$, Ar, $O_2$, CO, and $N_2$.

8. The method of claim 1, wherein the storage node contact mask includes KrF photoresist material, wherein the conductive plug is a landing plug contact.

9. A method for forming a storage node contact plug in a semiconductor device comprising:
    forming a first insulation layer over a substrate having a conductive plug;
    forming a plurality of bit line patterns over the first insulation layer, wherein each of the bit line patterns includes a hard mask having first, second, and third layers;
    forming a second insulation layer over the bit line patterns until a space between the bit line patterns is filled;
    planarizing the second insulation layer until the second layer of the hard mask is exposed;
    forming line type storage node contact masks over the planarized second insulation layer;
    sequentially etching the second insulation layer and the first insulation layer using the storage node contact masks as an etch mask to form a storage node contact hole between the bit line patterns, the storage node contact hole exposing the conductive plug, the storage node contact hole having an upper portion having sloping walls and a lower portion having vertical walls; and
    filling the storage node contact hole to form the storage node contact plug that contacts the conductive plug.

10. The method of claim 9, wherein the forming of the storage node contact hole comprises:
    etching a portion of the second insulation layer to form a trench with extended sidewalls; and
    etching another portion of the second insulation layer underneath the trench and the first insulation layer to form a second contact hole exposing the conductive plug.

11. The method of claim 10, wherein the forming of the first contact hole with the extended sidewalls comprises:
    anisotropically etching the second insulation layer using the storage node contact masks as an etch mask to form the first contact hole; and
    isotropically etching the second insulation layer patterned by the anisotropical etching to extend sidewalls of the first contact hole.

12. The method of claim 11, wherein the anisotropic etching is a dry etching performed at a pressure of approximately 15 mTorr to approximately 50 mTorr; a power of approximately 1,000 W to approximately 2,000 W; a gas mixture including at least two gases selected from the group consisting of $CF_4$, $C_4F_8$, $C_5F_8$, $C_4F_6$, $CHF_3$, $CH_2F_2$, Ar, $O_2$, CO, and $N_2$; and an etch target thickness of the second insulation layer ranging from approximately 1,000 Å to approximately 2,000 Å.

13. The method of claim 11, wherein the isotropic etching is a wet etching performed using a solution of HF.

14. The method of claim 10, wherein the forming of the second contact hole comprises performing a dry etching process.

15. The method of claim 14, wherein the dry etching process is performed at a pressure of approximately 15 mTorr to approximately 50 mTorr; a power of approximately 1,000 W to approximately 2,000 W; a gas mixture including at least two gases selected from the group consisting of $C_4F_8$, $C_5F_8$, $C_4F_6$, $CH_2F_2$, Ar, $O_2$, CO, and $N_2$.

16. The method of claim 15, wherein the hard mask of the bit line patterns comprises a nitride layer, a tungsten layer and an amorphous carbon layer formed in sequential order, wherein the amorphous carbon layer is removed when the second insulation layer is planarized.

17. The method of claim 16, wherein the nitride layer of the hard mask is formed to a thickness of approximately 1,000 Å to approximately 2,500 Å; the tungsten layer of the hard mask is formed to a thickness of approximately 300 Å to approximately 800 Å; and the amorphous carbon layer of the hard mask is formed to a thickness of approximately 1,000 Å to approximately 2,000 Å.

18. The method of claim 16, wherein the forming of the storage node contact plug comprises:
    forming spacers on sidewalls of the storage node contact holes;
    filling the storage node contact hole with a conductive layer, the conductive layer being provided over the second insulation layer and the spacers; and
    planarizing the conductive layer until the nitride layer of the hard mask is exposed.

19. The method of claim 18, wherein the forming of the spacers comprises:
    forming an insulation layer on the first and second insulation layers patterned by the dry etching and the wet etching; and
    etching the insulation layer such that the insulation layer remains on sidewalls of the first and second insulation layers while the tungsten layer of the hard mask is removed.

20. The method of claim 18, wherein the conductive layer includes polysilicon.

21. The method of claim 9, wherein the storage node contact mask includes KrF photoresist material.

22. A method for forming a storage node contact plug in a semiconductor device, the method comprising:
    forming an inter-layer insulation layer over a substrate having a conductive plug;
    etching a first portion of the inter-layer insulation layer to define a first trench having substantially vertical sidewalls;
    etching a second portion of the inter-layer insulation layer to convert the first trench into a second trench having sloping sidewalls;
    etching a third portion of the inter-layer insulation layer to form a third trench having substantially vertical sidewalls, the second trench and the third trench being connected to define a storage node contact hole; and
    filling the storage node contact hole to form a storage node contact plug that contacts the conductive plug,
    wherein the second trench defines an opening that is wider at an upper portion of the first contact hole than a lower portion of the first contact hole, so that the opening provides an increased contact area for the storage node contact plug.

* * * * *